United States Patent [19]

Caruso et al.

[11] Patent Number: 4,678,891
[45] Date of Patent: Jul. 7, 1987

[54] METHOD FOR ADJUSTING AN ELECTRICAL DEVICE BY ELECTRODE TRIMMING

[75] Inventors: Robert D. Caruso, Derry, N.H.; Joseph A. Messina, North Andover, Mass.

[73] Assignee: American Telephone and Telegraph Company, AT&T Technologies, Berkeley Heights, N.J.

[21] Appl. No.: 661,985

[22] Filed: Oct. 18, 1984

[51] Int. Cl.$^4$ ............................................. B23K 26/00
[52] U.S. Cl. ...................... 219/121 LJ; 219/121 LS; 219/121 LH; 219/121 LY; 219/121 EX; 356/152; 364/468; 29/25.35
[58] Field of Search .................. 219/121 LS, 121 LT, 219/121 LG, 121 LN, 121 LH, 121 LY, 121 EX, 121 EZ; 356/152, 153; 364/468; 29/25.35

[56] References Cited

U.S. PATENT DOCUMENTS

| | | | |
|---|---|---|---|
| 4,050,126 | 9/1977 | Ikeno et al. | 219/121 LM |
| 4,131,484 | 12/1978 | Caruso et al. | 219/121 LM |
| 4,156,156 | 5/1979 | Sweany et al. | 310/312 |
| 4,327,275 | 4/1982 | Asaba et al. | 219/121 LS |
| 4,532,401 | 7/1983 | Shiozaki et al. | 219/121 LH |
| 4,532,402 | 7/1985 | Overbeck | 219/121 LY |
| 4,584,455 | 4/1986 | Tomizawa | 219/121 LS |
| 4,587,396 | 5/1986 | Rubin | 219/121 LY |

OTHER PUBLICATIONS

"Laser Machining . . . Crystal Substrates," Journal of Applied Physics, vol. 40, No. 3, Jul. 1969, pp. 3157–3160.

Primary Examiner—M. H. Paschall
Attorney, Agent, or Firm—James H. Fox

[57] ABSTRACT

The frequency of a quartz crystal resonator (10) having a known radius (R) initially is adjusted upward toward a nominal resonant frequency in a "rough adjust" phase in which one or more lasered holes (24) are formed in a central portion of an outer electrode (12). The resonator (10) then is adjusted to the nominal resonant frequency in a "fine adjust" phase which initially involves utilizing a known coordinate position (70) and a laser (40) to determine coordinates (74 and 78) of two edge portions of the outer electrode (12). The edge portion coordinates (74 and 78) and the known electrode radius (R) then are used to determine coordinates (84) along an arc defined by a peripheral edge (28) of the outer electrode (12) in 5° increments (85). Lasered holes (26) then are formed in the electrode edge (28) to adjust the resonator (10) to the nominal resonant frequency. Additional lasered holes (30) also may be formed in the electrode (12) along an arc of reduced radius for this purpose, if necessary.

10 Claims, 12 Drawing Figures

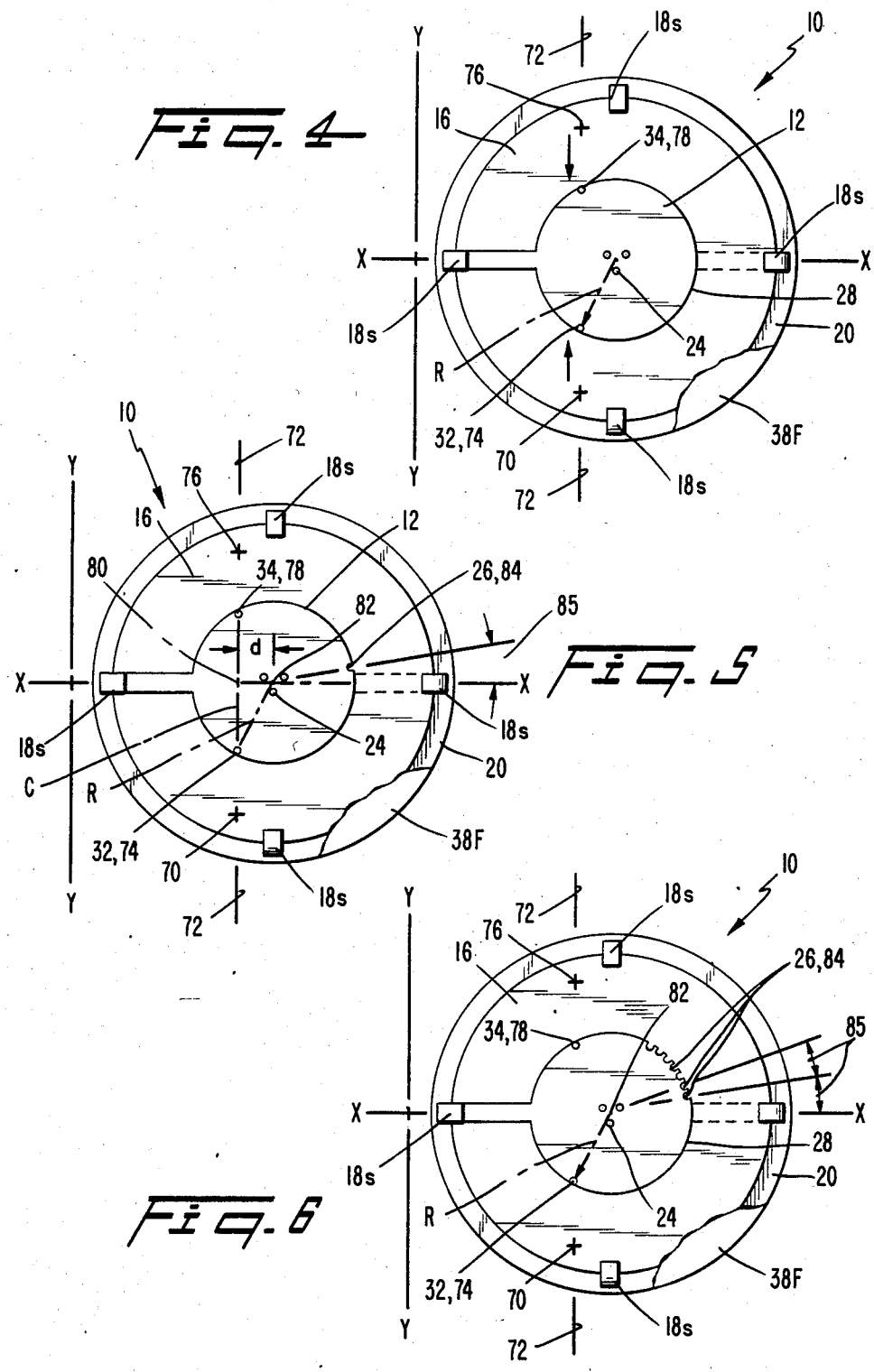

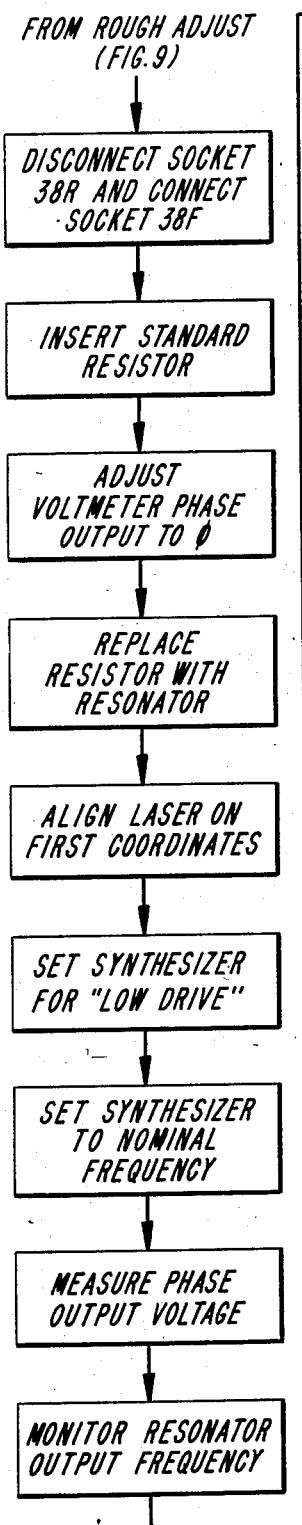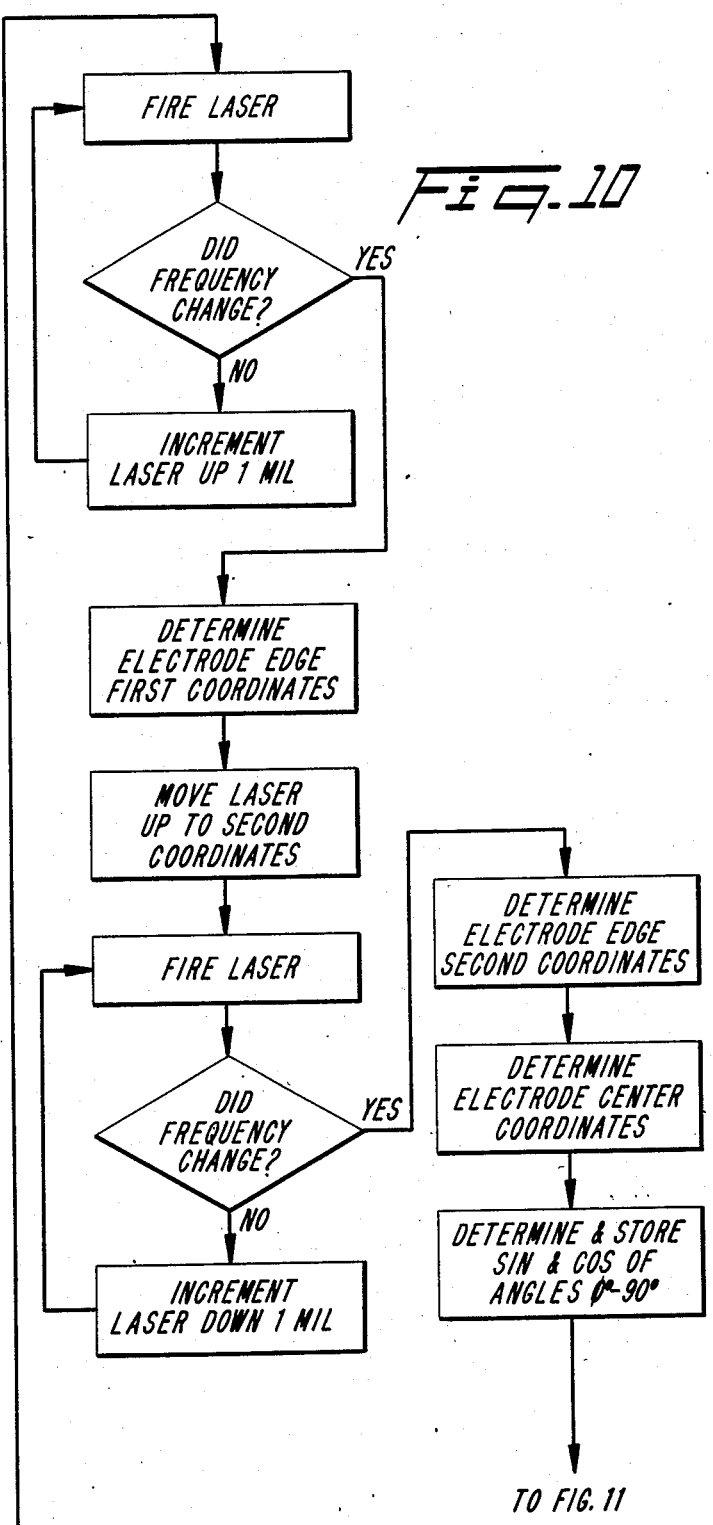
Fig. 10

METHOD FOR ADJUSTING AN ELECTRICAL DEVICE BY ELECTRODE TRIMMING

FIELD OF THE INVENTION

This invention relates to a method of and apparatus for adjusting an electrical device by electrode trimming, and more specifically to a method of and apparatus for adjusting or tuning the frequency of a sensitive high frequency piezoelectric crystal device to a nominal value without changing the insertion loss or "Q" of the device.

DESCRIPTION OF THE PRIOR ART

An article entitled "Laser-Machining Thin Film Electrode Arrays on Quartz Crystal Substrates," by J. L. Hokanson et al., published in the Journal of Applied Physics, Volume 40, No. 3, July 1, 1969, pages 3157–3160, discloses a system for the laser machining of electrode material from an electrode of a piezoelectric crystal device to adjust its frequency upward to a nominal value. In the case of a rectangular electrode, the electrode material is removed from an edge of the electrode. In the case of a circular electrode, the material is removed from a central strip portion of the electrode extending between opposite peripheral edge portions of the electrode.

The U.S. Pat. No. 4,131,484, issued Dec. 26, 1978 to R. D. Caruso et al. and entitled "Frequency Adjusting a Piezoelectric Device by Lasering", also discloses the adjusting of the resonant frequency of a piezoelectric crystal device by lasering material from a central strip portion of a circular outer electrode of the device. In addition, the piezoelectric crystal device also is electronically cleaned by overdriving the device at a high current level in comparison to its normal operating current level as electrode material is laser machined from the device to change its resonant frequency to a nominal value.

The laser maching method disclosed in the R. D. Caruso et al. U.S. Pat. No. 4,131,484 is suitable for adjusting the frequency of a piezoelectric crystal device having a circular outer electrode of a relatively large diameter, such as greater than 200 mils, and having a relatively low frequency, such as less than 6 MHz. However, the Caruso et al. system is not sensitive enough for adjusting a piezoelectric device of this type having a relatively small outer electrode, such as a diameter of 50-200 mils, and having a relatively high frequency, such as 6-80 MHz. It also has been found that removing material from a central strip portion of the outer electrode of one of these high frequency piezoelectric devices in the manner disclosed in the Caruso et al. patent tends to cause a detrimental change in the insertion loss (inductance) or "Q" value of the device. In this connection, it also has been found that by adjusting the high frequency piezoelectric crystal device to a nominal frequency value by removing portions of the outer electrode along its peripheral edge, the necessary degree of sensitivity adjustment required can be attained and any detrimental change in the "Q" value of the device as a result of the frequency adjusting operation can be eliminated.

However, the accurate removal of material from the outer electrode of the piezoelectric device along the peripheral edge of the electrode as above described, on an automatic basis, has been found to be difficult to achieve because of the difficulty of locating the outer electrode accurately in a coordinate system of a laser machining apparatus. In this connection, each of the piezoelectric devices is supported in the laser machining apparatus for a frequency adjusting operation by inserting flexible wire mounting leads of the device in an electrical socket of the apparatus. Further, since the locations of the outer electrodes of the piezoelectric crystal devices with respect to the wire mounting leads of the devices may vary from one device to another, the locations of the peripheral edges of the outer electrodes of the devices in the coordinate system of the laser machining apparatus also varies from one device to another. This problem is further compounded by the fact that the outer electrodes of the devices are relatively small in diameter as noted above, and that the laser machining of the electrode involves the removing of successive circular or semi-circular portions of electrode material which are only one mil in diameter.

Accordingly, a purpose of this invention is to provide a new and improved sensitive method of and apparatus for adjusting the frequency of a high frequency piezoelectric crystal device to a nominal value without causing a detrimental change in the "Q" value of the device, wherein the location of the peripheral edge of the outer electrode of the device in a laser machining coordinate system is accurately determined and portions of the electrode then are removed with a laser until the frequency of the device has reached the nominal value.

SUMMARY OF THE INVENTION

In general, an electrical device which includes a circular electrode of a known radius formed on a substrate, is adjusted to value by locating the electrical device in a coordinate system and locating electrode edge-engaging means into first and second coordinate positions, respectively. Relative movement then is caused between the electrical device and the electrode edge-engaging means to cause the electrode edge-engaging means to engage spaced first and second edge portions of the circular electrode associated with the first and second coordinate positions, respectively. The engagement of the electrode edge portions by the electrode edge-engaging means is detected and the relative distances traveled by the electrical device and the electrode edge-engaging means with respect to the first and second coordinated positions until engagement of the first and second electrode edge portions occurs, is measured to determine the coordinate positions of the electrode edge portions. The coordinate positions of the electrode edge portions and the radius of the circular electrode then are utilized to determine a coordinate position on the electrode from which material then is removed to change the value of the electrical device. More specifically, the electrical device is a crystal device which is tuned to a desired frequency utilizing a laser beam to remove electrode material from the device in separate "rough adjust" and "fine adjust" phases in sequence. In the "rough adjust" phase the coordinate position from which electrode material is removed is at the center of the electrode. In the "fine adjust" phase the coordinate position from which electrode material is removed is any of a plurality of coordinate positions which define an arc extending on the electrode adjacent a peripheral edge of the electrode edge portion, and from which electrode material is removed to change the frequency of the crystal device to the desired frequency. Additional material also may be removed from the electrode along arcs of progressively decreasing radii, if necessary, to tune the crystal device to the desired frequency.

BRIEF DESCRIPTION OF THE DRAWING

FIGS. 3-6 are enlarged plan views of the quartz crystal resonator of FIG. 1, illustrating a sequence of intermediate method steps in accordance with the invention;

FIGS. 9-12 are respective portions of a flow diagram for use in programming the apparatus shown in the block diagram of FIG. 7.

DETAILED DESCRIPTION

Figure 1:
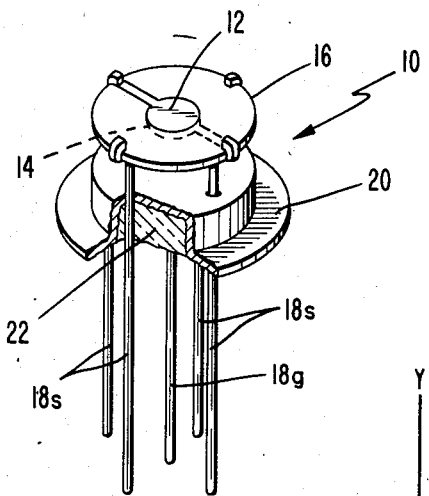
FIG. 1 is an isometric view of a quartz crystal resonator which may be adjusted to a desired resonant frequency in accordance with this invention.

Referring to FIG. 1, a high frequency quartz crystal resonator 10 of a known type which may be adjusted to a nominal resonant frequency (e.g., 6-80 MHz) in accordance with the disclosed embodiment of the invention has outer and inner circular electrodes 12 and 14 of a suitable contact metal, such as gold, vapor deposited or otherwise plated on opposite sides of a circular AT-cut quartz crystal body or wafer 16 in superimposed relationship. The electrodes 12 and 14 are of a relatively small radius R (FIGS. 2-6) of a known value, such as on the order of 25-100 mils, depending upon the nominal resonant frequency involved. The wafer 16 is fixedly mounted on four support leads 18s, two of which are electrically "active" and connected to respective ones of the electrodes 12 and 14, and two of which are electrically "inactive." The resonator 10 also includes a ground lead 18g secured to and extending from a cylindrical cap-shaped metal header 20. The leads 18s extend through apertures in the metal header 20 with portions of the leads embedded in a glass insulating material 22 in the header. After the resonator 10 has been adjusted to nominal resonant frequency, the wafer 16 is enclosed by a protective cover (not shown) which is crimped to the metal header 20 in a known manner.

Figure 2:
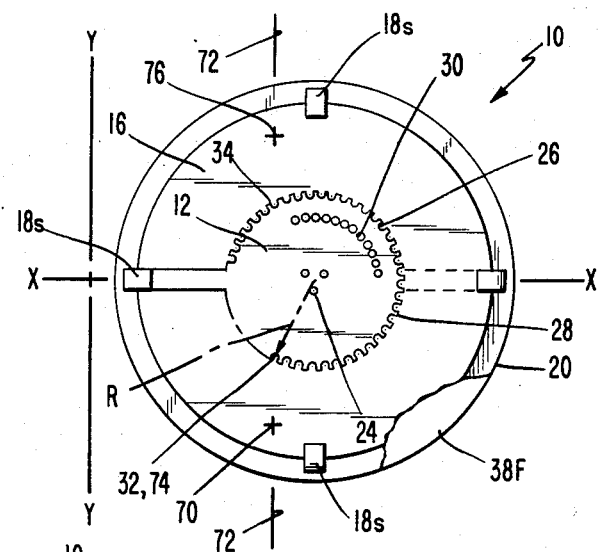
FIG. 2 is an enlarged plan view of the quartz crystal resonator of FIG. 1, illustrating a pattern in which electrode material may be lasered from the device in accordance with the invention.

Referring to FIG. 2, with the quartz crystal resonator 10 located in an X-Y coordinate system, a lasered pattern which may be formed in the outer electrode 12 of the resonator (and the inner electrode 14 of the resonator depending upon the thickness of the crystal body 16) to adjust the resonator to the nominal resonant frequency, includes one or more small (e.g., 1 mil) lasered holes 24 formed adjacent the center of the electrode. The formation of the lasered holes 24 is accomplished in a preliminary "rough adjust" phase of the frequency adjusting operation (FIGS. 3, 8 and 9) in which frequency of the resonator is changed upward from an initial frequency to a frequency having a preselected value less (e.g., 1 KHz) than the nominal resonant frequency. The lasered pattern further includes a series of peripherally spaced lasered semi-circular or circular holes 26 formed in or adjacent a peripheral edge 28 of the outer electrode 12 along an outer arc corresponding to the peripheral edge, and may include another series of lasered holes 30 formed in the electrode along an inner arc of reduced radius. The peripheral edge lasered holes 26 and the inner lasered holes 30 are formed in the outer electrode 12 in a "fine adjust" phase of the frequency adjusting operation (FIGS. 4-6 and 10-12) in which the resonant frequency of the resonator 10 is changed further upward from the "rough adjust" upper frequency to the nominal resonant frequency. In addition, the lasered electrode pattern includes first and second lasered holes 32 and 34, respectively, which are formed in respective first and second electrode peripheral edge portions, as illustrated in FIG. 4, in the determination of the location of the electrode peripheral edge 28 in the X-Y coordinate system.

Figure 7:
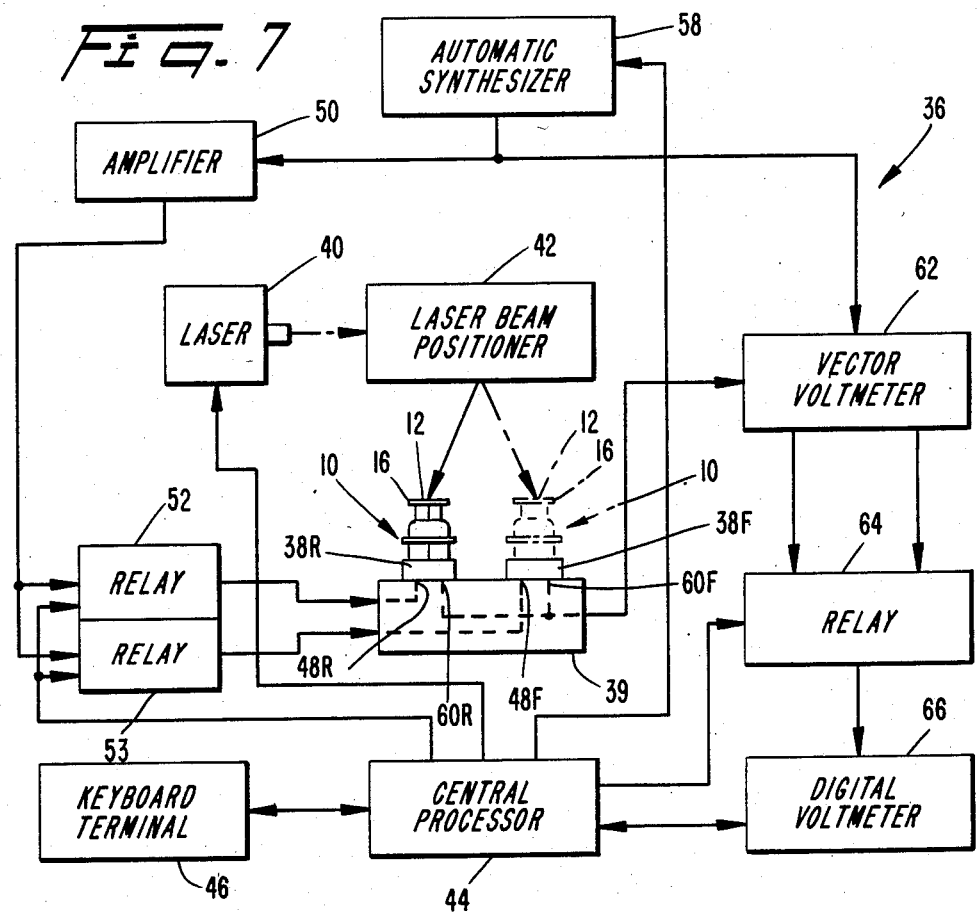
FIG. 7 is a schematic block diagram of an apparatus for adjusting the resonant frequency of the quartz crystal resonator shown in FIG. 1.

Referring to FIG. 7, the adjusting of the quartz crystal resonator 10 to the nominal resonant frequency may be accomplished utilizing a laser trimming apparatus 36, by mounting the resonator in a first electrical socket 38R for the "rough adjust" phase of the frequency adjusting operation, and then in a second electrical socket 38F for the "fine adjust" phase of the frequency adjusting operation. The electrical sockets 38R and 38F form parts of a fixedly mounted support fixture 39 of the laser trimming apparatus 36. The laser trimming apparatus 36 further includes a pulsed laser 40 and a laser beam positioner 42, which is located at the intersection of X and Y axes of an associated X-Y coordinate system. The laser beam positioner 42 includes a lens and mirror system (not shown) for traversing a pulsed beam from the laser 40 over preselected portions of the outer electrode 12 and the crystal wafer 16 of the resonator 10 in the frequency adjusting operation. In addition, the laser trimming apparatus 36 includes a central processor 44 connected to a keyboard terminal 46. The laser 40, laser beam positioner 42 and central processor 44 may be of known types, such as the Model #510 QT Nd:YAG laser of the Control Laser Corporation of Orlando, Florida, the Model BP-433 beam positioner of the Chicago Laser Corporation of Chicago, Ill. and the Model Z-80 MCZ central processor of the Zilog Corporation of Campbell, Calif., respectively.

Referring to FIGS. 2-6, the electrical sockets 38R and 38F are mounted on the support fixture 39 with centers of the sockets located on the X axis of the X-Y coordinate system for the laser beam positioner 42 (FIG. 7). The electrical sockets 38R and 38F include input contact pins 48R and 48F which are connectable in sequence to the output of an amplifier 50 for the "rough adjust" phase of the frequency adjusting operation (FIGS. 3 and 9) and the "fine adjust" phase of the frequency adjusting operation (FIGS. 4-6 and 10-12), respectively, by operation of respective relays 52 and 53 controlled by the central processor 44. The amplifier 50 drives the resonator 10 at a "high drive" current level on the order of 30-35 times its normal operating current level during the "rough adjust" phase (FIGS. 3 and 9) of the frequency adjusting operation to provide electronic cleaning of the resonator as disclosed in the U.S. Pat. No. 4,131,484, issued Dec. 26, 1978 to R. D Caruso et al. During the "fine adjust" phase of the frequency adjusting operation, however, the amplifier 50 drives the resonator 10 at its normal "low drive" operating current level.

In this connection, the input contact pin 48R is connected within the support fixture 39 to a suitable resistance circuit (not shown) which permits high current flow through the resonator 10 during the "rough adjust" phase of the frequency adjusting operation, while providing only an approximate impedance match with the resonator so as to reduce the power required to drive the resonator at the "high drive" current level. The input contact pin 48F, on the other hand, is connected within the support fixture 39 to another suitable resistance circuit (not shown) which provides an exact impedance match with the resonator 10 as the resonator is being driven at its resonant frequency and at its normal "low drive" current level in the "fine adjust" phase of the frequency adjusting operation. The use of the two different electrical sockets 38R and 38F connected to respective resistance circuits is considered more desirable than a single electrical socket utilizing switched resistance circuitry, from the standpoint of precluding the generation of standing waves in the laser trimming apparatus 36 which would interfere with the proper adjusting of the resonator 10 to the nominal resonant frequency. The amplifier 50 may be any suitable type, such as the Model 7805A amplifier available from the Harris Corporation of Milpitas, Calif. The relays 52 and 53 also may be of any suitable type, such as the Model 59307A VHF dual relay of the Hewlett Packard Company.

The amplifier 50 may be fed by any suitable power source capable of producing output signals of different desired power levels and at different frequencies in a range including the nominal resonant frequency of the resonator 10. By way of illustration, in the disclosed embodiment of the invention the amplifier 50 is fed by an automatic synthesizer 58, such as the Model #3335A synthesizer of the Hewlett-Packard Company of Palo Alto, Calif.

The electrical sockets 38R and 38F also include output contact pins 60R and 60F, respectively, which are connected to a vector voltmeter 62 capable of measuring the difference in voltage between the outputs of the resonator 10 and the synthesizer 58 and converting the measured voltage to frequency amplitude and phase angle analog voltage signals. Operation of a relay 64 by the central processor 44 then causes one or the other of the resultant analog voltage signals to be selectively fed from the vector voltmeter 62 to a digital voltmeter 66. The digital voltmeter 66 converts the analog voltage signal received from the vector voltmeter 62 to a digital signal representative of the measured voltage difference between the outputs of the resonator 10 and the synthesizer 58, and feeds this digital signal to the central processor 44 for comparison purposes in a known manner. The vector voltmeter 62, relay 64 and digital voltmeter 66 may be of any suitable types, such as those available from the Hewlett Packard Company of Palo Alto, Calif. as their Model No. 8405A vector voltmeter, No. 59306A relay and Model No. 3456A digital voltmeter.

Figure 9:
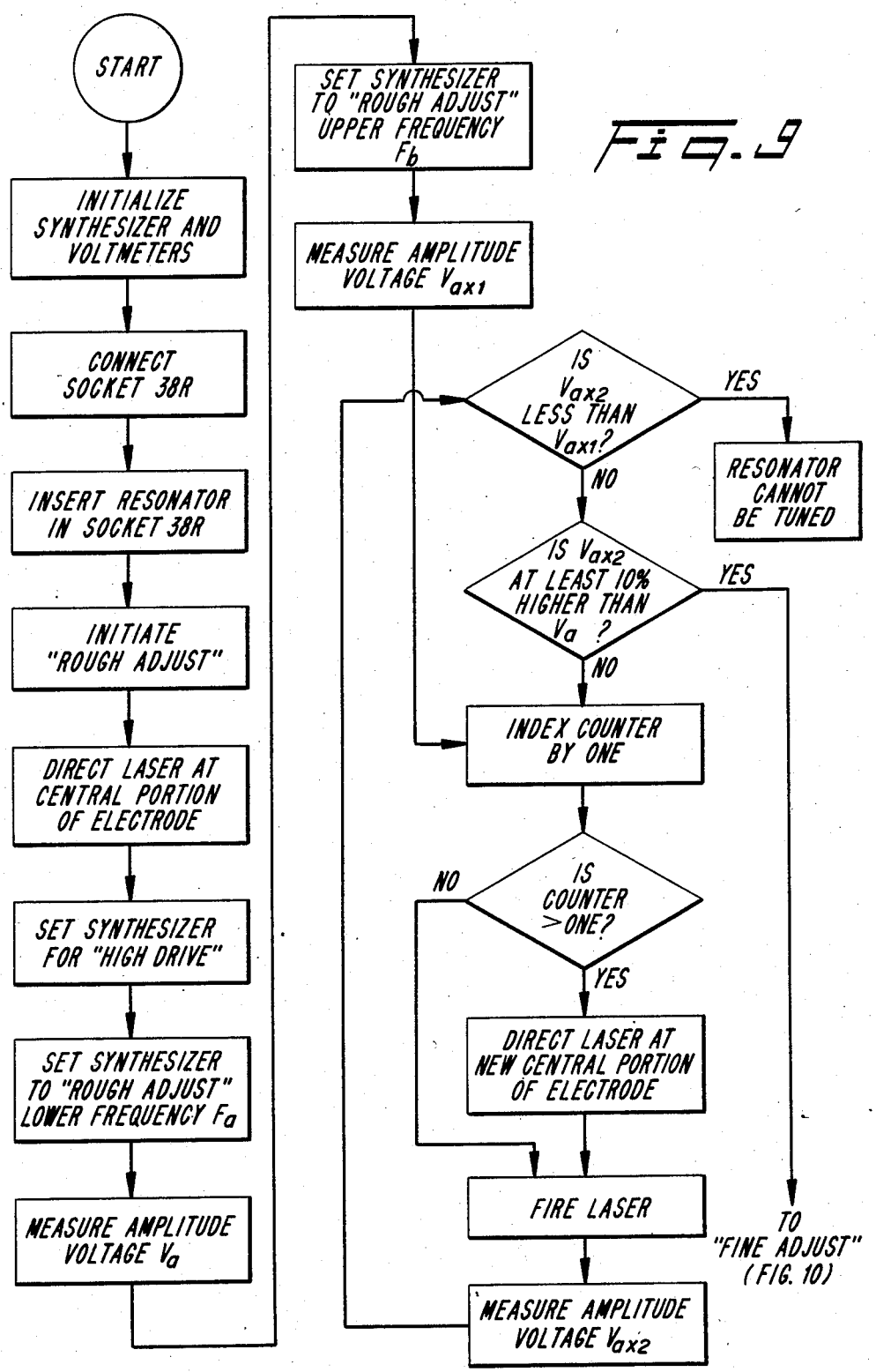
Figure 11:
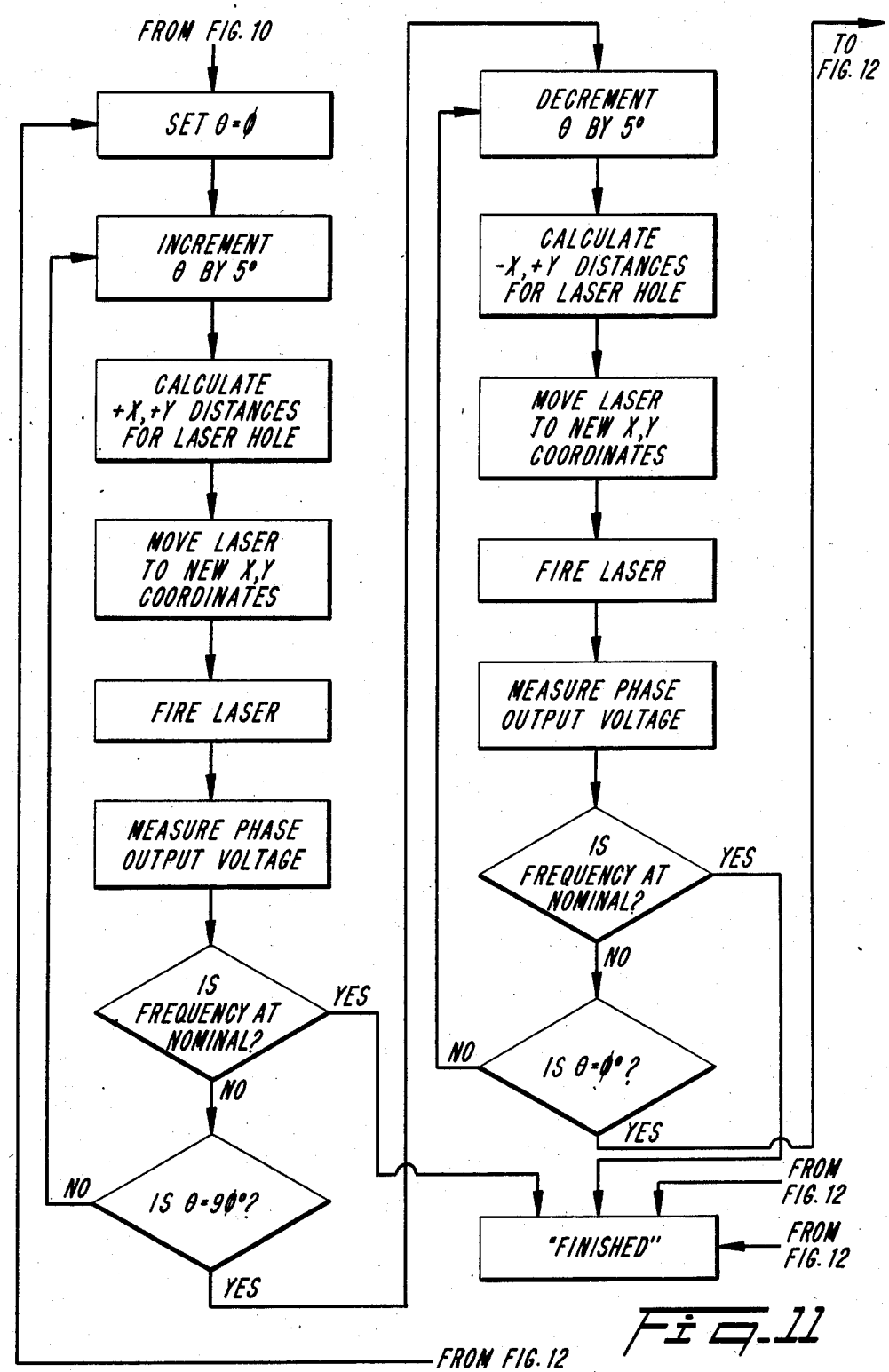

To adjust the resonator 10 to the nominal resonant frequency, with the value of the radius R of the resonator outer electrode 12 being known, the central processor 44 is programmed to execute directions as set forth in the flow diagrams of FIGS. 9–12. In this connection, the synthesizer 58 and the voltmeters 62 and 66 initially are set by the central processor 44 to appropriate operating parameters (e.g., frequency range, amplitude, etc.) dependent upon the nominal resonant frequency to which the resonator 10 is to be adjusted, as illustrated in FIG. 9.

In the "rough adjust" phase of the frequency adjusting operation, the resonator 10 is inserted in the electrical socket 38R and the "rough adjust" phase is initiated by pressing a suitable button (not shown) of the keyboard terminal 46. In the disclosed embodiment of the invention, with further reference to FIGS. 7 and 9, the laser beam positioner 42, under the control of the central processor 44, then directs the laser 40 at a central portion of the outer electrode 12 of the resonator 10. In this regard, since the exact location of the center of the outer electrode 12 in the socket 38R is not known, the location on the electrode toward which the laser is directed is only approximately at the electrode center. In the alternative, if greater accuracy is required in the "rough adjust" phase of the frequency adjusting operation, such as where the outer electrode 12 is of an extremely small diameter, the exact coordinates of the center of the electrode can be determined as subsequently described in the "fine adjust" phase of the frequency adjusting operation, if so desired.

Figure 8:
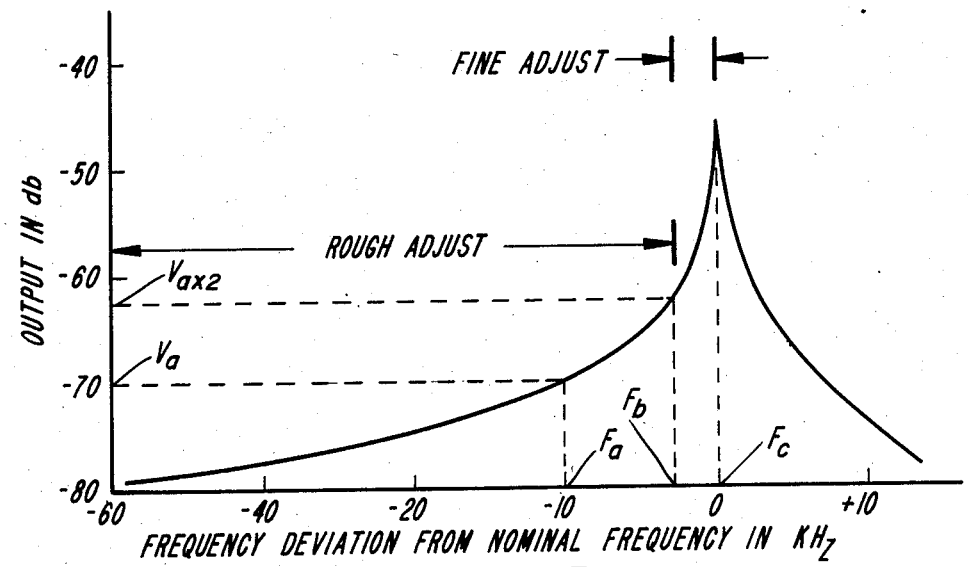
FIG. 8 is a chart illustrating "rough adjust" and "fine adjust" phases of the invention.

At the beginning of the "rough adjust" phase of the frequency adjusting operation, the central processor 44 also operates the relay 52 to connect the "rough adjust" electrical socket 38R to the amplifier 50. The synthesizer 58 then is set by the central processor 44 to operate at a "high drive" level and at a low frequency Fa, such as 10 KHz below the nominal resonant frequency to which the resonator 10 is to be adjusted, as illustrated in FIG. 8. The vector voltmeter 62 then measures the voltage differential between the outputs of the resonator 10 and the synthesizer 58 and converts the voltage differential to an amplitude analog voltage signal $V_a$, as for example corresponding to $-70$ db as illustrated in FIG. 8. The relay 64 also is operated by the central processor 44 to read the amplitude analog voltage signal $V_a$ from the vector voltmeter 62 to the digital voltmeter 66. The digital voltmeter 66 converts the analog voltage signal $V_a$ to a digital voltage signal, which then is stored in memory by the central processor 44.

The synthesizer 58 next is set by the central processor 44 to operate at a "rough adjust" upper frequency limit Fb (FIG. 8), such as a value on the order of 2.5 KHz below the nominal resonant frequency. A resultant amplitude voltage signal output $V_{ax1}$ (FIG. 9) of the vector voltmeter 62 then is again fed to and converted by the digital voltmeter 66 to a digital voltage signal which is stored in memory by the central processor 44.

Figure 3:
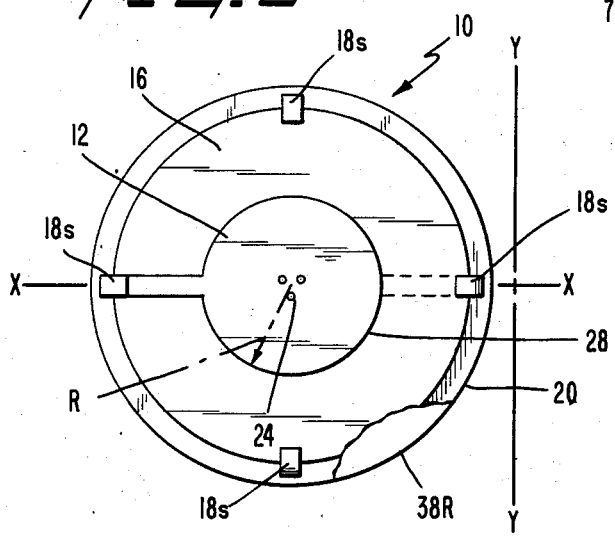

The central processor 44 then indexes an internal counter (not shown) and causes the laser 40 to fire to form a first one of the holes 24 in the central portion of the outer electrode, as illustrated in FIG. 3. A new amplitude voltage signal $V_{ax2}$ then is produced and compared with the first amplitude voltage signal $V_{ax1}$. A determination that the second amplitude voltage signal $V_{ax2}$ is less than the first amplitude voltage signal $v_{ax1}$ indicates that the frequency of the resonator is already above the nominal resonant frequency and that the resonator cannot be tuned. However, if the second amplitude voltage signal $V_{ax2}$ is greater than the first amplitude voltage signal $V_{ax1}$, the adjusting operation continues and the voltage signal $V_{ax2}$ is compared with the lower frequency amplitude voltage signal $V_a$. If the amplitude voltage signal $V_{ax2}$ exceeds the amplitude voltage signal $V_a$ by at least 10%, the "rough adjust" phase of the frequency adjusting operation is terminated as illustrated in FIG. 9. However, if the differential between the amplitude voltage signals $V_a$ and $V_{ax2}$ does not exceed 10%, the laser beam positioner 42 operates under the direction of the central processor 44 to direct the laser 40 at a new central portion of the outer electrode 12, whereupon the laser is again fired to form a second one of the holes 24 in the outer electrode 12. Additional holes 24 then may be formed in the central portion of the outer electrode 12 until the desired amplitude voltage differential is obtained, providing that the number of the holes formed does not become excessive so as to have a detrimental effect upon the inductance ("Q") of the resonator 10.

Referring to FIGS. 4, 7 and 10, after the "rough adjust" phase of the frequency adjusting operation has been completed, the electrical socket 38F is connected to the amplifier 50 in place of the electrical socket 38R. In the disclosed embodiment of the invention the laser trimming system 36 then is manually calibrated for determining when the resonator 10 has been tuned to the nominal resonant frequency. In this regard, since the resonator 10, when tuned to the nominal resonant frequency, will function as a pure resistor with zero reactance, a standard resistor (not shown) having a resistance corresponding to the resistance of the resonator when tuned to the nominal resonator frequency, initially is manually inserted into the electrical socket 38F and the phase output voltage of the vector voltmeter 62 then is manually adjusted to zero. The standard resistor then is replaced in the electrical socket 38F by the resonator 10, as shown in FIG. 7, and the "fine adjust" phase of the frequency adjusting operation is initiated by the operation of a suitable button (not shown) of the keyboard terminal 46.

In this connection, the laser beam positioner 42, under the direction of the central processor 44, then aligns the beam of the laser 40 on a known set of first X, Y, coordinates 70 (FIG. 4) on a bare portion of the crystal wafer 16. The central processor 44 also sets the synthesizer 58 for operation at a "low drive" level and the nominal resonant frequency Fc (FIG. 8), and operates the relay 64 (FIG. 7) to read the phase angle analog voltage signal measured by the vector voltmeter 62, to the digital voltmeter 66. The digital voltmeter 66 converts the analog voltage signal to a digital voltage signal for use by the central processor 44 as a reference which is representative of the frequency of the resonator 10 at the start of the "fine adjust" phase of the frequency adjusting operation.

While then monitoring for change in the phase angle voltage output of the vector voltmeter 62, and thus for change in the output of the frequency of the resonator 10, the central processor 44 fires the laser 40. Since at this state in the "fine adjust" phase of the frequency adjusting operation the laser 40 is directed at a bare portion of the crystal wafer 16, no material is removed from the outer electrode 12 of the resonator 10 and the frequency of the resonator does not change. The central processor 44 then causes the laser beam positioner 42 to increment the laser 40 upward on a Y-axis 72 on which the first known coordinates 70 are located, a preselected distance, such as one mil, and again fires the laser. This procedure is continued until a change in frequency of the resonator 10 is detected, as a result of the laser having reached the peripheral edge 28 of the outer electrode 12 and removed material from the electrode to form the hole 32 therein, as illustrated in FIG. 4. Utilizing the number of times the laser 40 was incremented from the known first coordinates 70, the central processor 44 then determines X, Y, coordinates 74 for the electrode edge 28 at the hole 32 and stores this information in memory.

The central processor 44 next causes the laser beam positioner 42 to move the laser 40 upward along the Y-axis 72 a preselected distance (e.g., 250 mils) in a de-energized state such that the laser is directed at a second bare portion of the crystal wafer 16 at second X, Y coordinates 76, as shown in FIG. 4. The monitoring of the frequency of the resonator 10, the firing of the laser 40 and the incrementing of the laser then is repeated, as above described in the determining of the X, Y coordinates 74 of the lasered electrode edge hole 32, except that the laser is incremented downward instead of upward, as viewed in FIG. 4. When a change in frequency in the resonator 10 is detected by the central processor 44 as a result of the laser 40 reaching the lasered hole 34 in the electrode, downward incrementing of the laser is stopped. The central processor 44, using the distance which the laser 40 was moved upward from the first electrode edge coordinates 74, and the number of times the laser was incremented downward from the X, Y coordinates 76, then determines X, Y coordinates 78 of the electrode edge 28 and the lasered hole 34 and stores this information in memory.

Referring to FIG. 5, utilizing the stored coordinates 74 and 78 for the electrode edge 28 at the lasered holes 32 and 34, respectively, the central processor 44 then determines the length of a chord C of the outer electrode 12 extending between the lasered holes. The central processor 44 then determines X, Y coordinates 80 of a center point of the chord C by adding one-half of the chord length value C/2 to the electrode edge Y-coordinate 74, or by subtracting the value C/2 from the electrode edge Y-coordinate 78. Next, utilizing the value C/2 and the electrode radius R, a distance d from the center of the chord C to the center of the outer electrode 12 is determined by the known mathematical formula $R^2 - C^2/2 = d^2$. The distance d then is utilized to determine X, Y coordinates 82 of the center of the outer electrode 12.

The central processor 44 next determines sine and cosine values for angles $\phi°$- 90° in 5° increments and stores this information in memory. Then, referring to FIG. 5, utilizing the stored sine and cosine values the central processor 44 determines X, Y coordinates 84 of a first point on an arc defined by the electrode edge 28 and located along the edge a distance of 5° from the X-axis of the resonator 10, by calculating X and Y distances from the electrode center coordinates 82. The laser 40 then is moved by the laser beam positioner 42, to the first electrode edge coordinates 84 and the laser is fired to form one of the holes 26 in the electrode edge 28, thereby increasing the frequency of the resonator 10 toward the nominal resonant frequency. The phase output voltage of the resonator 10 then is again measured as above described, and if it is found to be zero, indicating that the frequency of the resonator 10 is at the nominal resonant frequency, the frequency adjusting operation is terminated. However, if the frequency of the resonator 10 is found to be not at the nominal resonant frequency, which at this stage of the frequency adjusting operation will normally be the case, the central processor 44 determines a new set of the coordinates 84 for a next point located an additional 5° increment 85 along the electrode peripheral edge 28 and another one of the holes 26 is lasered in the electrode edge. This process is repeated about the entire electrode peripheral edge 28, if necessary, as illustrated in FIGS. 2 and 6, until the phase output voltage of the resonator 10 is equal to zero, indicating that the resonator 10 has reached the nominal resonant frequency.

Figure 12:
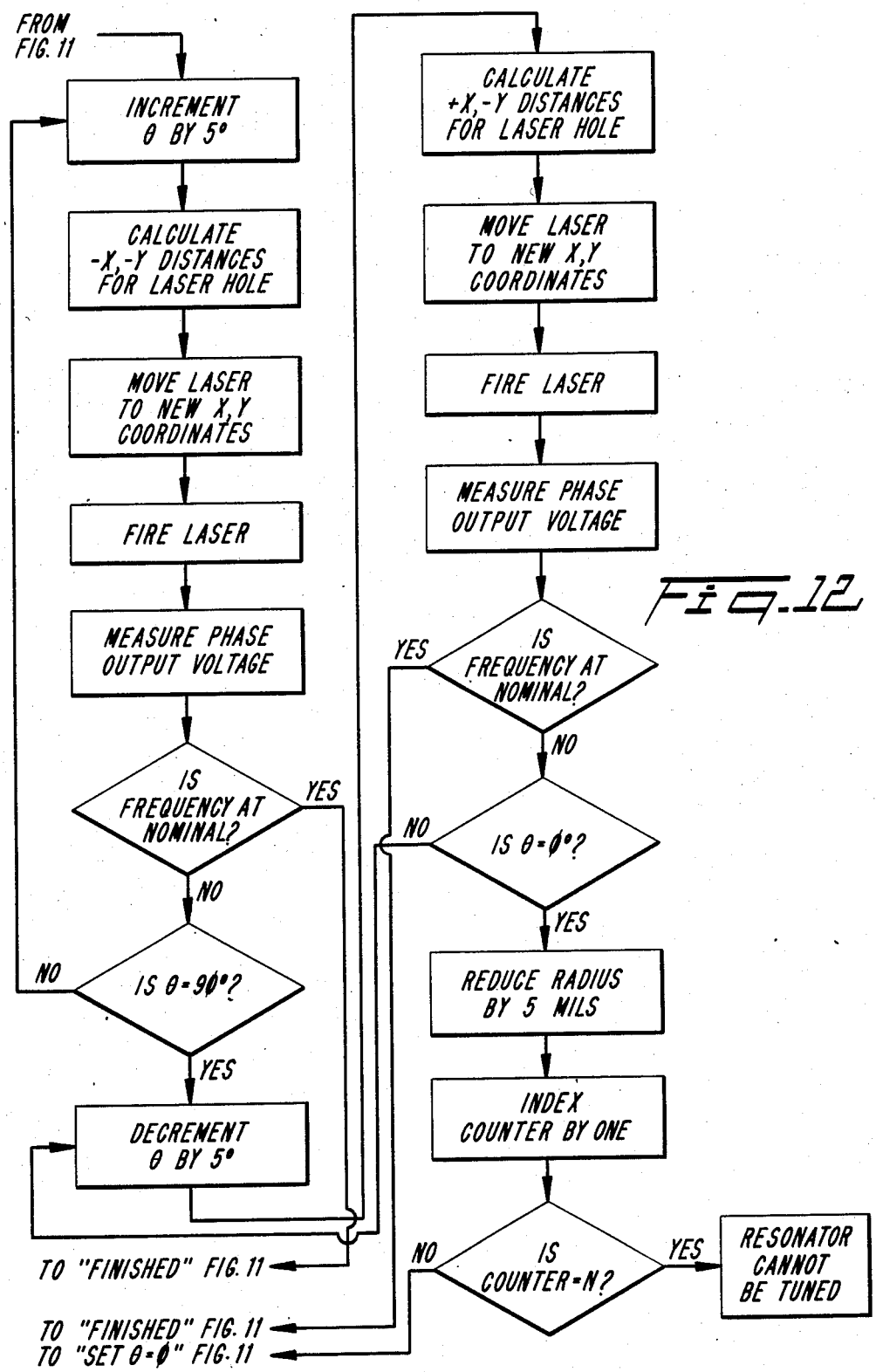

Referring to FIGS. 2 and 12, in the event that the resonator 10 still has not reached the nominal resonant frequency by the time the lasered holes 26 have been formed entirely about the electrode peripheral edge 28, the lasered holes 30 (FIG. 2) may be formed in the outer electrode 12 along an inner arc having a radius which is reduced a preselected amount, such as 5 mils, with respect to the radius R of the electrode. Similarly, if the frequency of the resonator 10 has not reached the nominal resonant frequency by the time the lasered holes 30 have been formed in a full circle about the electrode, an additional series of lasered holes (not shown) may be formed in the electrode 12 along another inner arc of further reduced radius. This lasering procedure may be continued a preselected number of times "N" (FIG. 12) along additional arcs of further reduced radii until such time that the amount of electrode material removed has a detrimental effect on the characteristics (e.g., the "Q") of the resonator 10, in which case the resonator must be discarded as not being capable of being tuned or adjusted to the nominal resonant frequency.

In summary, new and improved methods of and apparatus for adjusting highly sensitive electrical devices, such as the quartz crystal resonator 10, to a desired value, such as a nominal resonant frequency, have been disclosed. Initially, the frequency of the resonator 10 may be adjusted from an initial value to a value slightly below (e.g., 1 KHz) the nominal resonant frequency, in a "rough adjust" phase of the frequency adjusting operation, by lasering one or more of the holes 24 in the central portion of the resonator outer electrode 12, as shown in FIGS. 3 and 9. Utilizing the known X, Y coordinates 70 (FIG. 4) as a starting position, the lasered holes 32 and 34 then are sequentially formed in the peripheral edge 28 of the outer electrode 12, as illustrated in FIGS. 4 and 10, to define coordinate position locations 74 and 78 of the peripheral edge and the electrode chord C (FIG. 5). The chord C and the known radius R of the outer electrode 12 then are utilized to determine the distance d from the center 80 of the chord C to the center 82 of the outer electrode, and to determine the X, Y coordinates of the electrode center. Utilizing standard sine and cosine values, referring to FIGS. 5, 6, 11 and 12, coordinate positions 84 then are determined for the peripheral edge 28 of the outer electrode 12 in 5° increments 85 (FIGS. 5 and 6), and lasered holes 26 are formed about the peripheral edge, as necessary, to adjust the resonator 10 to the nominal resonant frequency. Additional lasered holes 30 (FIG. 2) also may be formed in the outer electrode 12 along one or more arcs (only one shown in FIG. 2) of reduced radii with respect to the electrode radius R, to adjust the esonator 10 to the nominal resonant frequency, if necessary.

What is claimed is:

1. A method of adjusting an electrical device to a desired value, wherein the electrical device includes a circular electrode of a known radius formed on a substrate, which method comprises the steps of:
   locating the electrical device in a coordinate system;
   causing relative movement between the electrical device and an electrode edge-engaging means to cause the electrode edge-engaging means to engage spaced first and second edge portions of the circular electrode associated with first and second coordinate positions, respectively;
   detecting the engagement of the spaced first and second electrode edge portions by the electrode edge-engaging means;
   measuring the relative distances traveled by the electrical device and the electrode edge-engaging means with respect to the first and second coordinate positions until the electrode edge-engating means engages the spaced first and second electrode edge portions, respectively, to determine the coordinate positions of the electrode edge portions;
   utilizing the coordinate positions of the spaced first and second electrode edge portions and the known radius of the circular electrode to determine coordinate positions on the electrode which define at least one arc which extends on the electrode adjacent a peripheral edge of the electrode; and
   removing material from the circular electrode along the defined arc to change the value of the electrical device.

2. The method of adjusting an electrical device to a desired value, as recited in claim 1, which comprises the preliminary step of:
   removing material from a central portion of the circular electrode to change the value of the electrical device, prior to removing material from the electrode along the defined arc adjacent the peripheral edge of the electrode.

3. The method of adjusting an electrical device to a desired value, as recited in claim 1, which comprises the additional steps of:
   determining additional coordinate positions on the circular electrode to define, as may be necessary for further adjustment of the electrical device to the desired value, additional arcs which extend on the electrode at progressively decreasing radii with respect to a radius of the first defined arc; and
   removing additional material from the circular electrode along the additional defined arcs, as necessary, to change the value of the electrical device to the desired value.

4. The method of adjusting an electrical device to a desired value, as recited in claim 1, in which:
   the first and second coordinate positions are on a same coordinate axis of the coordinate system; and
   the relative movement which is caused between the electrical device and the electrode edge-engaging means is parallel to the coordinate axis.

5. The method of adjusting an electrical device to a desired value, as recited in claim 1, in which:
   the electrode edge-engaging means which engages the spaced first and second edge portions of the circular electrode is a laser beam which removes electrode material from the first and second electrode edge portions to cause respective first and second changes in the value of the electrical device;
   the first and second changes in the value of the electrical device are detected to detect when the laser beam has engaged the first and second edge portions of the circular electrode; and
   the electrode material also is removed from the circular electrode along the defined arc by a laser beam.

6. The method of adjusting an electrical device to a desired value, as recited in claim 1, in which:
   the electrode edge-engaging means initially is located into the first coordinate position;
   the electrode edge-engaging means is moved from the first coordinate position toward the circular electrode until the electrode edge-engaging means engages the first edge portion of the circular electrode;

the electrode edge-engaging means is moved from the first edge portion of the circular electrode a preselected distance to locate the electrode edge-engaging means into the second coordinate position; and the electrode edge-engaging means is moved from the second coordinate position toward the circular electrode to engage the second edge portion of the circular electrode.

7. The method of adjusting an electrical device to a desired value, as recited in claim 6, in which:

the first and second coordinate positions are on a same coordinate axis of the coordinate system; and the relative movement which is caused between the electrical device and the electrode edge-engaging means involves moving the electrode edge-engaging means in a first direction along the coordinate axis from the first coordinate position to the first electrode edge portion, and in a reverse direction along the coordinate axis from the second coordinate position to the second electrode edge portion.

8. The method of adjusting an electrical device to a desired value, as recited in claim 7, in which:

the electrode edge-engaging means is a laser beam which removes electrode material from the spaced first and second edge portions of the circular electrode to cause respective first and second changes in value of the electrical device;

the first and second changes in value of the electrical device are detected to detect when the laser beam has engaged the spaced first and second edge portions of the circular electrode; and the electrode material also is removed from the circular electrode along the defined arc on the circular electrode by a laser beam.

9. A method of tuning a crystal device to a desired frequency, wherein the crystal device includes a circular electrode of a known radius formed on a crystal plate, which method comprises the steps of:

supporting the crystal device in a coordinate system adjacent a known first coordinate position;

advancing a laser beam from the known first coordinate position in a first direction along a coordinate axis toward an adjacent first edge portion of the circular electrode such that the laser beam engages the first electrode edge portion to remove electrode material from the first electrode edge portion and thereby cause a first change in frequency of the crystal device;

locating a laser beam in a second coordinate position on the coordinate axis at a preselected distance from the first edge portion of the circular electrode such that the second coordinate position is adjacent a second edge portion of the circular electrode;

advancing the located laser beam which is located in the second coordinate position, from the second coordinate position in a reverse direction along the coordinate axis toward the second edge portion of the circular electrode such that the laser beam engages the second electrode edge portion to remove electrode material from the second electrode edge portion and thereby cause a second change in frequency of the crystal device;

monitoring the frequency of the crystal device as the laser beams are advanced toward the circular electrode, to detect the first and second changes in frequency caused by the advancing laser beams removing electrode material from the first and second electrode edge portions, respectively;

interrupting further engagement of the laser beams with the circular electrode upon detecting the first and second changes in frequency, respectively, of the crystal device;

measuring the distances traveled by the advancing laser beams along the coordinate axis from the first and second coordinate positions to the first and second electrode edge portions, respectively, to determine coordinate positions of the first and second electrode edge portions;

utilizing the coordinate positions of the first and second electrode edge portions and the known radius of the circular electrode to determine coordinate positions on the electrode which define at least one arc which extends on the electrode adjacent the peripheral edge of the electrode; and advancing a laser beam along the defined arc on the circular electrode to remove portions of the electrode adjacent the peripheral edge of the electrode and thereby change the frequency of the crystal device.

10. The method of tuning a crystal device to a desired frequency, as recited in claim 9, which comprises the additional steps of:

determining additional coordinate positions on the circular electrode to define, as may be necessary for further tuning of the crystal device to the desired frequency, additional arcs which extend on the circular electrode at progressively decreasing radii with respect to a radius of the first defined arc;

advancing the laser beam along the additional defined arcs to remove additional portions of the circular electrode, as may be necessary to tune the crystal device to the desired frequency;

monitoring the frequency of the crystal device as the laser beam removes the portions of the circular electrode along the defined arcs on the electrode, to detect when the crystal device has attained the desired frequency; and interrupting further engagement of the laser beam with the circular electrode when the crystal device has attained the desired frequency.

* * * * *